US008207882B1

(12) United States Patent  
Jennings

(10) Patent No.: US 8,207,882 B1  
(45) Date of Patent: Jun. 26, 2012

(54) ANALOG-TO-DIGITAL CONVERTER (ADC) HAVING A FOLDING STAGE AND MULTIPLE ADC STAGES

(75) Inventor: John K. Jennings, Glenageary (IE)

(73) Assignee: Xilinx, Inc., San Jose, CA (US)

( * ) Notice: Subject to any disclaimer, the term of this patent is extended or adjusted under 35 U.S.C. 154(b) by 7 days.

(21) Appl. No.: 12/963,541

(22) Filed: Dec. 8, 2010

(51) Int. Cl.  
H03M 1/34 (2006.01)

(52) U.S. Cl. .......................... 341/162; 341/155; 341/160

(58) Field of Classification Search ........... 341/140–165  
See application file for complete search history.

(56) References Cited

U.S. PATENT DOCUMENTS

| 7,095,354 | B2 * | 8/2006 | Harrison et al. | 341/159 |
| 7,710,305 | B2 * | 5/2010 | Taft | 341/156 |
| 7,920,084 | B2 * | 4/2011 | Taft | 341/156 |
| 7,936,299 | B2 * | 5/2011 | Astley et al. | 341/172 |
| 2011/0102220 | A1 * | 5/2011 | Nam et al. | 341/122 |

OTHER PUBLICATIONS

Quinn, P.; et al. *Capacitor Matching Insensitive 12-bit 3.3 MS/s Algorithmic ADC in 0.25 μm CMOS*, Custom Integrated Circuits Conference, 2003, Proceedings of the IEEE 2003, Sep. 21-24, 2003, pp. 425-428, Xilinx Ireland, Dublin, Ireland.

* cited by examiner

*Primary Examiner* — Lam T Mai  
(74) *Attorney, Agent, or Firm* — LeRoy D. Maunu

(57) ABSTRACT

An A/D converter including a folding stage and a plurality of conversion stages is described. The folding stage determines a sub-range in which an input analog voltage falls and adjusts the input analog voltage by a folding voltage offset corresponding to the determined sub-ranges to produce a residue voltage. Each following converter stage determines a voltage range in which the residue voltage falls. The converter stage multiplies the residue voltage by a factor of N to produce an intermediate voltage. The conversion stage selects a cyclic voltage offset corresponding to the sub-ranges in which the residue voltage falls and adjusts the intermediate voltage by the cyclic voltage offset to produce a new residue voltage.

20 Claims, 3 Drawing Sheets

ANALOG-TO-DIGITAL CONVERTER (ADC) HAVING A FOLDING STAGE AND MULTIPLE ADC STAGES

FIELD OF THE INVENTION

One or more embodiments generally relate to signal processing, and more particularly to analog-to-digital conversion (ADC).

BACKGROUND

An analog-to-digital (A/D) converter converts an input analog signal to an output digital signal that is an approximation of the input analog signal. The resolution of an A/D converter defines the accuracy of the approximation between the output digital signal and the input analog signal. In this regard, the closer the resemblance between the output digital signal and the input analog signal, the greater the resolution of the A/D converter. A/D converters may be designed with various architectures known in the art. In general, each A/D converter architecture can have specific characteristics making it suitable or unsuitable for a particular application.

One A/D conversion method is known as algorithmic A/D conversion. An algorithmic A/D converter may be referred to as a cyclic A/D converter, and such terms are used interchangeably herein. Algorithmic A/D converters operate in a manner similar to successive approximation. In successive approximation, an analog voltage is compared to a reference voltage over a number of cycles. As used herein, each cycle is referred to as an A/D converter stage.

In each stage, the analog voltage is compared to the reference voltage to determine a digital bit value. If the input voltage is greater than the reference voltage, the reference voltage is subtracted from the input voltage. The remaining voltage, referred to as either the remainder or residue, is input to the next stage for more accurate comparison. In each successive stage, the reference voltage is generally halved to increase accuracy of the comparison with the residue and determine the next less-significant bit. In algorithmic A/D conversion, a fixed set of reference voltages is used for each comparison. As with successive approximation, the analog voltage is compared with a reference voltage to determine a digital value. However, in successive stages the residue is generally doubled and again compared with the fixed reference voltages to increase accuracy and determine the next less significant bit.

Algorithmic A/D converters provide an architecture for performing A/D conversion that is efficient in terms of required hardware and power. However, algorithmic A/D converters often require digital calibration of analog errors, which reduces the range of the analog signal that can be accurately quantized to digital values. The ideal transfer function of an A/D converter is a straight line with unity slope where the digital output code is mapped perfectly onto the input signal range. The two common errors of a real implementation are the zero-order error and the first-order error. The zero-order error corresponds to the mapping of each code onto the signal range with the same offset to the ideal. The first-order error corresponds to a slope error of the straight-line mapping. The zero-order error and first-order error may also be referred to as offset error and gain error, respectively. To compensate for these errors, digital calibration is performed to correct the measured values. Uncorrected digital values are determined and stored. Subsequently, a calculation is performed using these stored values to determine corrected values.

For example, if every measured voltage is high by 10 mV, then the correction subtracts a digital value corresponding to 10 mV from all measurements. A zero volt input signal will result in a raw code corresponding to 10 mV, but after correction will result in a final code corresponding to zero. However the full scale output, for most A/D converters, is limited to (or saturates at) a digital value representing the full scale of the input range so that after correction a code corresponding to full scale minus 10 mV will result. All input signals within 10 mV of full scale will similarly saturate, and the net effect is that the output range goes from zero code to only code corresponding to full scale minus 10 mV. Digital calibration of analog errors in an A/D converter consumes part of the signal range to perform the correction in existing algorithmic A/D converters.

One or more embodiments of the disclosure may address one or more of the above issues.

SUMMARY

In one embodiment, an A/D converter is provided. The A/D converter includes a folding stage that is configured to determine, based on a comparison of the input analog voltage to one or more first reference voltages, one of a first plurality of sub-ranges of the input voltage range in which an input analog voltage falls. A folding voltage offset, which corresponds to the determined sub-ranges, is selected from a first set of voltage offsets. The folding stage offset is configured to adjust the input analog voltage by a folding voltage offset corresponding to the determined one of the sub-ranges to produce a residue voltage.

The A/D converter includes a plurality of stages. A first one of the stages is configured to receive the residue voltage produced by the folding stage, and each other stage is configured to receive a residue voltage from a previous one of the stages. Each of the stages is configured to determine one of a second plurality of sub-ranges of the input voltage range in which the received residue voltage falls based on a comparison of the received residue voltage to one or more second reference voltages. Each stage multiplies the received residue voltage by a factor of N to produce an intermediate voltage. Each stage is further configured to select a cyclic voltage offset corresponding to the determined one of the sub-ranges from a second set of voltage offsets, and is configured to adjust the intermediate voltage by the cyclic voltage offset.

In another embodiment an A/D converter is provided. The A/D converter includes an input selection switch having a first input coupled to an input of the A/D converter and a second input coupled to an output of the A/D converter. A sample-and-hold circuit is coupled to an output of the input selection switch. A comparison circuit is coupled to an output of the sample-and-hold circuit and is configured to determine within which sub-range of a plurality of sub-ranges a voltage received from the output of the input selection switch is contained. A multiplication circuit is coupled to receive a voltage from the output of the sample-and-hold circuit. The multiplication circuit is configured to multiply the received voltage by a factor of 1 during a first cycle of the ADC and set the enable signal to cause the multiplication circuit to multiply the received voltage by a factor of N during remaining cycles of the ADC. A selection circuit is coupled to the comparison circuit and is configured to select a voltage offset corresponding to the sub-range determined by the comparison circuit from a set of voltage offsets. Each voltage offset corresponds to a respective one of the plurality of sub-ranges. An addition circuit is coupled to an output of the multiplication circuit and to an output of the selection circuit. The addition circuit is configured to add the voltage offset to an output of the multiplication circuit.

A method for performing A/D conversion is provided in another embodiment. The method determines a sub-range in which an input analog voltage falls, based on a comparison of the input analog voltage to one or more first reference voltages. The input analog voltage is offset by a folding voltage offset that corresponds to the determined sub-ranges to produce a residue voltage. The folding voltage offset is selected from a first set of voltage offsets. Each voltage offset of the first set corresponds to a respective one of the plurality of sub-ranges. For one or more iterations, the logic circuit is used to determine the sub-ranges in which the residue voltage falls, multiply the residue voltage by a factor of N to produce an intermediate voltage, select a cyclic voltage offset corresponding to the determined sub-range, and adjust the intermediate voltage by the cyclic voltage offset to produce an updated residue voltage.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Current algorithmic A/D converters are subject to analog errors, which can reduce the effective input voltage range of an analog signal that can be accurately quantized to digital values. One or more embodiments present a circuit and method for A/D conversion that accurately quantize measured values across the full input voltage range, rail-to-rail. The algorithmic A/D converter includes an initial folding stage followed by a plurality of algorithmic A/D conversion stages. The folding stage folds the analog input voltage into two or more sub-ranges. By initially folding the input voltage, an input voltage having an amount of offset error is placed within a sub-range that will not result in saturation in the algorithmic A/D converter stages.

Algorithmic A/D converters may be implemented in a number of ways, using various numbers of reference voltages and corresponding sub-ranges for comparison in each A/D converter stage. For ease of explanation, the embodiments and examples disclosed herein are discussed in the context of 1.5 bit A/D conversion. One skilled in the art will recognize the embodiments may be modified to implement algorithmic A/D converters with a larger or smaller number of reference voltages and corresponding sub-ranges.

Figure 1:
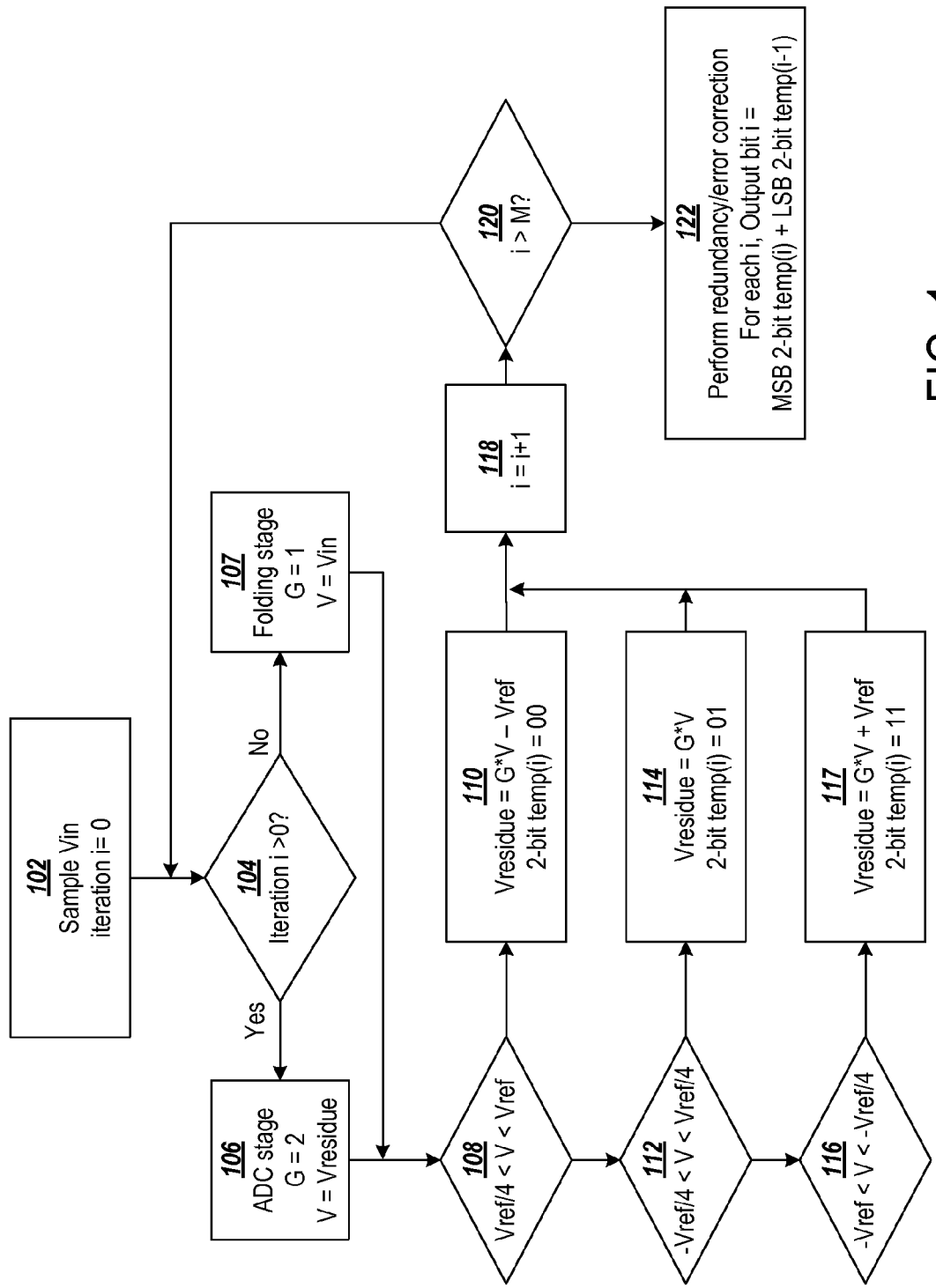
FIG. 1 shows a circuit diagram of an example algorithmic A/D converter.

FIG. 1 shows a flowchart of a process for 1.5-bit algorithmic A/D conversion. The A/D conversion process is initialized at block 102 where an analog input voltage (Vin) is sampled. An iteration counter, i, which is used to track the current stage of the A/D conversion process, is reset to zero. If the counter indicates the converter is in the first iteration as determined at decision block 104 (i=0), the process is configured to operate in a folding stage (G=1) with V=Vin as shown by block 107. Otherwise the process is configured to operate in an A/D converter (ADC) stage (G=2) with V=Vresidue as shown by block 106.

In this 1.5-bit example, two comparison voltages (Vref/4 and −Vref/4) are used to place the input voltage into one of three sub-ranges in the folding stage and in each ADC stage. The three sub-ranges include: an upper sub-range (between Vref/4 and Vref) determined as decision block 108; a middle sub-range (between −Vref/4 and Vref/4) determined at decision block 112; and a lower sub-range (between −Vref and −Vref/4) determined at decision block 116.

In either mode, in response to determining a sub-range in which the input voltage/residue (Vin) falls at one of the decision steps 108, 112, or 116, the input voltage/residue (Vin) is quantized and processed at blocks 110, 114, or 117, respectively.

While operating in the folding mode, process blocks 110, 114, and 117 adjust the input/residue voltage by a folding offset voltage as follows, $$Vresidue = Vin + Voffset,$$

where Voffset is equal to one of the values of Vref, 0, and −Vref in response to Vin falling into one of the respective upper 108, the middle 112, and lower 116 sub-ranges. This folds voltages located outside of the input voltage range into the effective input voltage range of the first A/D converter stage.

While operating in the ADC mode (G=2), the residue voltage input to the stage (Vin) is multiplied by a gain of two and adjusted by a cyclic offset voltage as follows, $$Vresidue = 2*Vin + Voffset,$$

where Voffset is equal to the values Vref, 0, and −Vref in response to Vin falling into one of the respective upper 108, the middle 112, and lower 116 sub-ranges.

In each of processing blocks, 110, 114, and 117, a quantized digital value (2-bit temp(i)) is output for the A/D conversion stage. In this example, the 2-bit digital values are 00, 01, and 11 for respective upper, middle, and lower sub-regions. Following each stage, the iteration counter i is incremented at block 118 and the process is repeated until the iteration count i is greater than M at decision step 120.

From the above equations, it can be seen that when input voltage Vin is greater than Vref, the resulting residue (2*Vref−Vref) will be greater than Vref (the upper limit of the input voltage range in this example). As a result, the A/D converter stage will saturate and the effective range is reduced. A similar result occurs for Vin less than −Vref. However, an error resulting from a voltage that is offset beyond the input range is prevented by the processing performed at blocks 110, 114, and 117 while in folding mode (G=1). As a result of these folding mode operations, out of range voltages (i.e., Vin<−Vref and Vin>Vref) are folded into the effective input range to prevent saturation during subsequent operation in the ADC mode.

Each 1.5-bit ADC stage generates a 2-bit value that includes some redundancy in order to provide a large tolerance for component tolerances and imperfections. Redundancy and error correction operations are performed at block 122 to determine a 1-bit digital value for each stage i. To determine a 1-bit digital value for each stage i, the most significant bit of the 2-bit value is added to the least significant bit of the previous stage. The 1-bit digital values produced for each stage are concatenated to form the raw digital value of the analog input voltage.

The following example illustrates redundancy and error correction of three 1.5-bit A/D converter stages. As shown in Example 1 below, each stage produces 2-bits. The least significant bit is summed with the most significant bit of the next stage. Discarding the most significant bit of the first stage the digital output is '110.'

| Stage 1→ | 1 | 1 | | |
|---|---|---|---|---|
| Stage 2→ | | 0 | 1 | |
| Stage 3→ | + | | 0 | 0 |
| | 1 | 1 | 1 | 0 |

EXAMPLE 1

This correction can be implemented with series adders or other logic circuit. One skilled in the art will recognize that other correction techniques may be performed to convert the binary output of each stage and correct errors.

Figure 2:
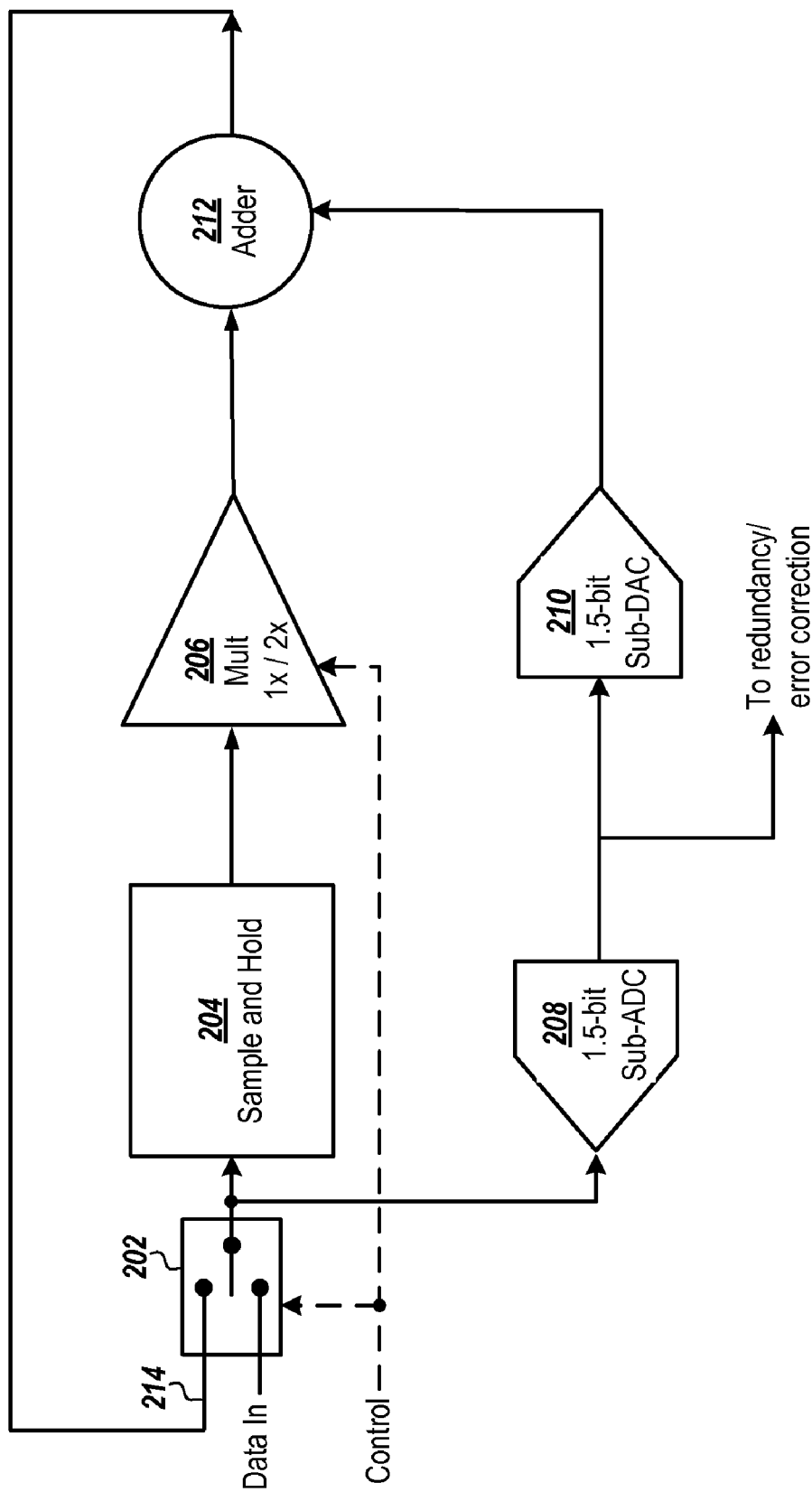
FIG. 2 shows a circuit diagram of a pipelined algorithmic A/D converter.

FIG. 2 shows a circuit diagram of an example algorithmic A/D converter. In this example, the circuit is configured to perform operations for one A/D converter stage. Output is fed back to the input for M+1 iterations to implement an M-bit A/D converter. The A/D converter circuit includes a switch circuit 202 configured to selectably switch between input of Data_In and a residue voltage 214, which is fed back from an output of the A/D converter circuit, in response to a control signal. A sample and hold circuit 204 is coupled to an output of the switch circuit 202. A multiplication circuit 206 is coupled to an output of sample and hold circuit 204. The multiplication circuit is configured to multiply the input by 2 in response to the control signal.

A 1.5-bit sub-ADC circuit 208 is coupled to the output of the switching circuit and is configured to determine one of a plurality of sub-ranges in which the input voltage selected by switching circuit 202 falls. A two-bit digit digital value is output from the sub-ADC 208 to a digital redundancy and error correction circuit (not shown). A 1.5-bit sub-digital-to-analog converter (sub-DAC) 210 is coupled to convert the two-bit digit digital value into a corresponding reference voltage. One skilled in the art will recognize that the sub-ADC and sub-DAC circuits 208 and 210 may be implemented using a number of different A/D converter architectures including Flash, Wilkerson, Algorithmic, etc. An adder 212 is coupled to add the output of the multiplication circuit 206 to the reference voltage produced by sub-DAC 210. An output of the adder is fed back as residue voltage 214 to the switch 202.

In this example, the A/D converter circuit is configured to operate in two different modes in response to the control signal. The control signal causes the A/D converter circuit to operate in a folding mode for the first iteration and in an ADC mode for the remaining M iterations. When in the folding mode, the switch circuit 202 is configured to input the analog signal Data_In, and multiply circuit 206 is configured to multiply the input value received from sample and hold circuit 204 by a factor of 1. When operating in the ADC mode, the switch circuit 202 is configured to input residue voltage 214 to the A/D converter circuit and the multiplier is configured to increase the accuracy of the residue voltage by multiplying the input residue by 2.

This implementation provides a hardware-efficient solution that requires hardware for only one A/D conversion stage. The embodiment reuses much of this hardware to perform the initial folding stage operations with little additional hardware.

While the example embodiment shown in FIG. 2 is hardware efficient, it may not provide the throughput necessary for many applications. In one or more embodiments, a pipelined A/D converter is provided using a series of cascaded stages implemented in hardware. The pipelined A/D converter includes a hardware implementation of each A/D conversion stage as well as the folding stage. When the first stage is finished processing an input, the residue is passed to the next stage. While the next stage is processing the input, a new input can be received and processed by the first stage. Because the stages work simultaneously, the number of stages used to obtain a given resolution is not limited by the latency of the entire A/D conversion process.

Figure 3:
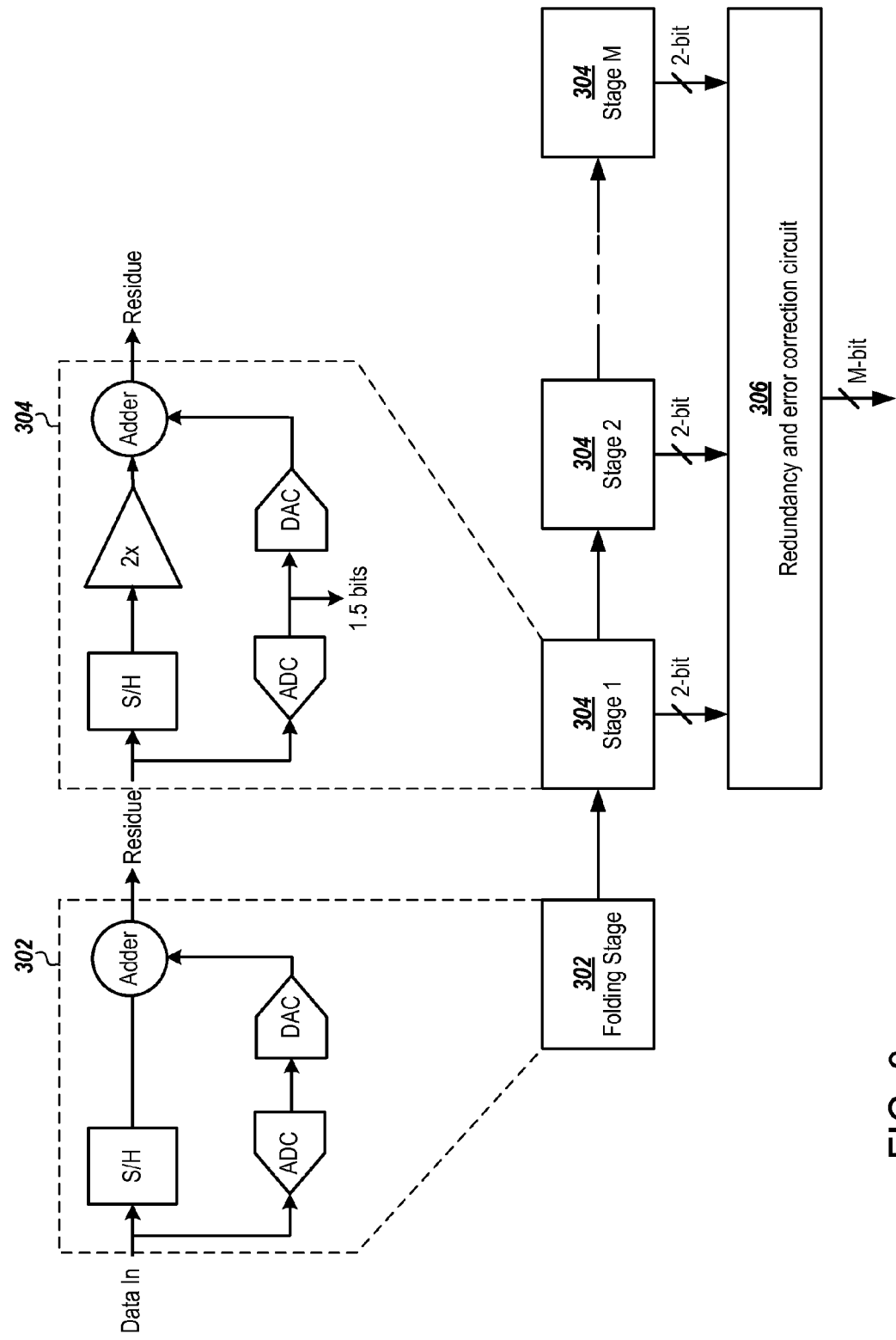
FIG. 3 shows a flowchart of a process for analog to digital conversion.

FIG. 3 shows a block diagram of a general pipelined ADC with M-stages. The pipelined A/D converter includes a folding stage 302 followed by M A/D conversion stages 304. Each stage 304 includes a sample and hold circuit, an ADC comparator, a DAC reference voltage generator, a multiply-by-2 circuit, and an adder as shown in FIG. 2. The folding stage 302 is similar to the A/D conversion stages 304 but lacks a multiplication circuit. Outputs of the A/D conversion stages 304 are received and converted by redundancy and error correction circuit 306, as described above, which outputs the digital values representing the measured analog inputs.

One or more embodiments of the present invention are thought to be applicable to a variety of systems for A/D conversion. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope and spirit of the invention being indicated by the following claims.

What is claimed is:

1. An analog to digital converter (ADC), comprising:
a folding stage, configured to:
  determine one of a first plurality of sub-ranges of the input voltage range in which an input analog voltage falls based on a comparison of the input analog voltage to one or more first reference voltages, and
  offset the input analog voltage by a folding voltage offset corresponding to the determined one of the sub-ranges to produce a residue voltage, the folding voltage offset selected from a first set of voltage offsets, and each voltage offset in the first set corresponding to a respective one of the plurality of sub-ranges; and
a plurality of ADC stages,
  wherein a first one of the plurality of ADC stages is configured to receive the residue voltage produced by the folding stage, and each other ADC stage of the plurality of ADC stages is configured to receive a residue voltage from a previous one of the plurality of ADC stages; and
  wherein each of the plurality of ADC stages is configured to:
    determine one of a second plurality of sub-ranges of the input voltage range in which the received residue voltage falls based on a comparison of the received residue voltage to one or more second reference voltages,
    multiply the received residue voltage by a factor of N to produce an intermediate voltage,
    select a cyclic voltage offset corresponding to the determined one of the second plurality of sub-ranges from a second set of voltage offsets, each voltage offset of the second set corresponding to a respective one of the second plurality of sub-ranges, and adjust the intermediate voltage by the cyclic voltage offset.

2. The ADC of claim 1, wherein the first plurality of sub-ranges and one or more first reference voltages are respectively equal to the second plurality of sub-ranges and one or more second reference voltages.

3. The ADC of claim 1, wherein the folding stage and plurality of ADC stages are implemented by one circuit configured to perform operations of the folding stage while operating in a first mode and perform operations of the plurality of ADC stages while operating in a second mode.

4. The ADC of claim 1, wherein the ADC is a pipelined ADC, and the plurality of ADC stages includes a plurality of ADC circuits coupled in series.

5. The ADC of claim 3, wherein the one circuit includes a multiplier circuit configured to multiply the received residue voltage by a factor of 1 while operating in the first mode and multiply the received residue voltage by a factor of 2 while operating in the second mode.

6. The ADC of claim 1, further comprising a digital error correction circuit coupled to receive digital values representing the determined ones of the second plurality of sub-ranges from the plurality of ADC stages and is configured to produce a digital value representing the analog input to the ADC.

7. The ADC of claim 1, wherein the second plurality of sub-ranges consists of three sub-ranges, and N is equal to a factor of 2.

8. The ADC of claim 1, wherein the second plurality of sub-ranges consists of two sub-ranges and N is equal to a factor of 2.

9. An analog-to-digital converter (ADC), comprising:
an input selection switch having a first input coupled to an input of the ADC and a second input coupled to an output of the ADC;
a sample-and-hold circuit coupled to an output of the input selection switch;
a comparison circuit coupled to an output of the sample-and-hold circuit and configured to determine within which sub-range of a plurality of sub-ranges a voltage received from the output of the input selection switch is contained;
a multiplication circuit coupled to receive a voltage from the output of the sample-and-hold circuit, and configured to multiply the received voltage by a factor of 1 during a first cycle of the ADC and set the enable signal to cause the multiplication circuit to multiply the received voltage by a factor of N during remaining cycles of the ADC;
a selection circuit coupled to the comparison circuit and configured to select a voltage offset corresponding to the sub-range determined by the comparison circuit from a set of voltage offsets, each voltage offset of the set of voltage offsets corresponding to a respective one of the plurality of sub-ranges; and
an addition circuit coupled to an output of the multiplication circuit and to an output of the selection circuit, the addition circuit configured to add the voltage offset to an output of the multiplication circuit.

10. The ADC of claim 9, wherein:
the plurality of sub-ranges consists of three sub-ranges and the comparison circuit is configured to produce a 1.5-bit digital value indicating which of the plurality of sub-ranges the voltage received from the output of the input selection switch is contained; and
N is equal to a factor of 2.

11. The ADC of claim 10, wherein the comparison circuit includes a 1.5-bit sub-ADC circuit having an input coupled to an input of the comparison circuit and a 1.5-bit sub-digital-to-analog converter (sub-DAC) circuit having an input coupled to an output of the 1.5-bit sub-ADC circuit.

12. The ADC of claim 9, wherein the plurality of sub-ranges consists of two sub-ranges.

13. The ADC of claim 12, wherein the comparison circuit includes a difference amplifier having a first input coupled to the output of the sample-and-hold circuit and a second input coupled to a reference voltage.

14. The ADC of claim 9, further comprising a control circuit coupled to a control input of the input selection switch and to a control input of the multiplication circuit, the control circuit configured to set the enable signal to cause the multiplication circuit to multiply the received voltage by the factor of 1 during the first cycle of the ADC and set the enable signal to cause the multiplication circuit to multiply the received voltage by the factor of N during remaining cycles of the ADC, wherein the control circuit is further coupled to the control input of the input selection switch and is configured to cause the input selection switch to couple the output of the input selection switch to the first input of the input selection switch during the first cycle of the ADC and cause the input selection switch to couple the output of the input selection switch to the second input of the input selection switch during remaining cycles of the ADC.

15. The ADC of claim 9, wherein the comparison circuit is a flash ADC circuit.

16. A method of performing analog to digital conversion (ADC), comprising:
determining one of a first plurality of sub-ranges of the input voltage range in which an input analog voltage falls based on a comparison of the input analog voltage to one or more first reference voltages;
offsetting the input analog voltage by a folding voltage offset corresponding to the determined one of the plurality of sub-ranges to produce a residue voltage, the folding voltage offset selected from a first set of voltage offsets, and each voltage offset in the first set corresponding to a respective one of the plurality of sub-ranges; and
for one or more iterations, performing the steps including:
determine one of a second plurality of sub-ranges of the input voltage range in which the residue voltage falls based on a comparison of the received residue voltage to one or more second reference voltages;
multiply the residue voltage by a factor of N to produce an intermediate voltage;
select a cyclic voltage offset corresponding to the determined one of the sub-ranges from a second set of voltage offsets, each voltage offset of the second set corresponding to a respective one of the plurality of sub-ranges; and
adjust the intermediate voltage by the cyclic voltage offset to produce an updated residue voltage.

17. The method of claim 16, wherein the first plurality of sub-ranges and one or more first reference voltages are respectively equal to the second plurality of sub-ranges and one or more second reference voltages.

18. The method of claim 16, wherein the second plurality of sub-ranges consists of three sub-ranges, and N is equal to a factor of 2.

19. The method of claim 16, wherein the second plurality of sub-ranges consists of two sub-ranges and N is equal to a factor of 2.

20. The method of claim 16, further comprising using the logic circuit to perform digital error correction circuit to produce a digital value representing the analog input to the ADC.

* * * * *